United States Patent
Lin et al.

(10) Patent No.: US 10,833,131 B2
(45) Date of Patent: Nov. 10, 2020

(54) TOUCH CONTROL DISPLAY PANEL, DISPLAY DEVICE HAVING THE SAME AND METHOD OF FABRICATING THE SAME

(71) Applicant: EverDisplay Optronics (Shanghai) Limited, Shanghai (CN)

(72) Inventors: Hsin Chih Lin, Shanghai (CN); Tangliang Zhao, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days.

(21) Appl. No.: 16/363,419

(22) Filed: Mar. 25, 2019

(65) Prior Publication Data

US 2019/0305053 A1    Oct. 3, 2019

(30) Foreign Application Priority Data

Mar. 28, 2018  (CN) .......................... 2018 1 0263816
Aug. 8, 2018   (CN) .......................... 2018 1 0897306

(51) Int. Cl.
```
G06F 3/041     (2006.01)
H01L 27/32     (2006.01)
H01L 51/52     (2006.01)
H01L 51/56     (2006.01)
H05K 1/11      (2006.01)
```

(52) U.S. Cl.
CPC .......... *H01L 27/323* (2013.01); *G06F 3/0416* (2013.01); *H01L 27/3276* (2013.01); *H01L 51/5281* (2013.01); *H01L 51/56* (2013.01); *H05K 1/118* (2013.01); *G06F 2203/04103* (2013.01); *H01L 2227/323* (2013.01); *H05K 2201/10128* (2013.01); *H05K 2201/10151* (2013.01)

(58) Field of Classification Search
USPC .................... 345/156, 173, 174, 33, 39, 418
See application file for complete search history.

(56) References Cited

U.S. PATENT DOCUMENTS

| | | | | |
|---|---|---|---|---|
| 2015/0144920 A1* | 5/2015 | Yamazaki | ............. | H01L 27/323 257/40 |
| 2016/0232395 A1* | 8/2016 | Han | ...................... | G06F 1/1684 345/173 |
| 2016/0278201 A1* | 9/2016 | Cheon | ................. | H01L 27/3276 345/156 |
| 2017/0277345 A1* | 9/2017 | Agematsu | ............. | G06F 3/0412 345/174 |
| 2018/0097040 A1* | 4/2018 | Yamazaki | ............. | G06F 3/0412 345/173 |
| 2018/0224986 A1* | 8/2018 | Tanaka | ...................... | G09G 3/36 345/418 |
| 2019/0212869 A1* | 7/2019 | Agematsu | ............. | G06F 3/0412 345/174 |
| 2019/0303640 A1* | 10/2019 | Song | .................. | G06K 9/00033 345/173 |

\* cited by examiner

*Primary Examiner* — Thuy N Pardo
(74) *Attorney, Agent, or Firm* — Yunling Ren

(57) ABSTRACT

A touch control display panel includes a display area and a border area, wherein the border area is extended along a first direction, and the border area and the display area are arranged along a second direction perpendicular to the first direction. The border area includes a flexible-printed-circuit (FPC) touch control driver bonding area and a chip-on-film (COF) display driver bonding area, wherein the FPC touch control driver bonding area and the COF display driver bonding area are arranged along the first direction.

18 Claims, 17 Drawing Sheets

TOUCH CONTROL DISPLAY PANEL, DISPLAY DEVICE HAVING THE SAME AND METHOD OF FABRICATING THE SAME

CROSS REFERENCE

This application is based upon and claims the benefit of priority of Chinese Patent Applications No. 201810263816.1, filed on Mar. 28, 2018, and No. 201810897306.X, filed on Aug. 8, 2018, the entire contents thereof are incorporated herein by reference.

TECHNICAL FIELD

The present disclosure relates to the field of display technology, specifically to an on-cell touch control display panel, a display device having the on-cell touch control display panel, and a method of fabricating the on-cell touch control display panel.

BACKGROUND

With the development of the market, the mobile phone display screen design is mainly toward to high screen-to-body ratio, narrow border, and full screen in recent years. The display screen using Active Matrix Organic Light Emitting Diode (AMOLED) has advantages of high image quality, high contrast and high color protection, and the market share of the traditional liquid crystal display is gradually reduced, and the display screen using AMOLED becomes the main configuration of the new-generation mobile phone display screen.

Generally, the rigid AMOLED display screen has functions of on-cell touch, wherein the rigid AMOLED display screen includes the touch control sensors located on the encapsulating cover of the rigid AMOLED display screen.

During fabricating the narrow border of the rigid AMOLED display screen, it is easier to form the narrow border of the rigid AMOLED display screen while the top border, the left border and the right border are formed, and the width of the narrow border, less than 0.85 mm, is done by the current process.

The bottom border is the main bottleneck to achieving narrow border. The main reason is that the bottom border is the main output side for wiring the display screen, and the COG (chip-on-glass) chip, the FPC (flexible-printed-circuit) board or the COF (chip-on-film) flexible circuit board are bonded here. Further, the FPC touch control driver is also wired and bonded here. Thus, it is difficult to narrow the bottom border.

The bottom border of the AMOLED display screen of the prior art is described as the following two examples.

Example 1

As shown in FIGS. 1 and 2, the display screen includes a display area 1' and a bottom border area 2'. Components from the edge of the light emitting device layer to the edge of the bottom glass of the display screen in this example are shown in table 1.

TABLE 1

(components of the bottom border of example 1):

| | | Components of the bottom border | mm | Main limitations |
|---|---|---|---|---|
| Top glass | A1 | From active area (AA) to the edge of POL | 0.5 | 1. The precision of cutting and filming of POL is in a range of −200 μm to 200 μm;<br>2. POL extends out of AA in a range of −300 μm to 300 μm. |
| | A2 | From the edge of POL to TP Pad | 0.3 | 1. The precision of cutting and filming of POL is in a range of −200 μm to 200 μm;<br>2. The distance from the edge of TP FPC to TP Pad is 50 μm;<br>3. The precision of cutting and bonding of TP FPC is in a range of −50 μm to 50 μm. |
| | A3 | The height of TP Pad along the y-axis direction | 0.5 | Bonding impedance |
| | A4 | From the bottom of TP Pad to the edge of the top glass | 0.05 | The precision tolerance of glass cutting is in a range of −50 μm to 50 μm. |
| Bottom glass | A5 | From the edge of the top glass to COF | 0.36 | 1. The precision of bonding and hot-pressing is in a range of −250 μm to 250 μm;<br>2. The distance from the edge of COF to COF Pad is in a range of −50 μm to 50 μm;<br>3. The precision of cutting and bonding of COF is in a range of −50 μm to 50 μm. |
| | A6 | The height of COF Pad along the y-axis direction | 0.6 | Bonding impedance |
| | A7 | From the bottom of COF Pad to the edge of the bottom glass | 0.05 | The precision tolerance of glass cutting is in a range of −50 μm to 50 μm. |
| | | Total | 2.36 | |

The active area (AA) represents a visible area, which corresponds to a light emitting device layer, POL represents a polarizer layer, TP Pad represents an FPC touch control driver bonding area, TP FPC represents a touch control flexible circuit board, COF represents a display flexible circuit board, and COF Pad represents a COF display driver bonding area.

Example 2

A5 and A6 are further narrowed on the basis of example 1.

As shown in FIGS. 3 and 4, the display screen includes a display area 1' and a bottom border area 2'. Components from the edge of the light emitting device layer to the edge of the bottom glass of the display screen in this example are shown in table 2.

TABLE 2

(components of the bottom border of example 2):

| | | Components of the bottom border | mm | Main limitations |
|---|---|---|---|---|
| Top glass | B1 | From AA to the edge of POL | 0.5 | 1. The precision of cutting and filming of POL is in a range of −200 μm to 200 μm; 2. POL extends out of AA in a range of −300 μm to 300 μm. |
| | B2 | From the edge of POL to TP Pad | 0.3 | 1. The precision of cutting and filming of POL is in a range of −200 μm to 200 μm; 2. The distance from the edge of TP FPC to TP Pad is 50 μm; 3. The precision of cutting and bonding of TP FPC is in a range of −50 μm to 50 μm. |
| | B3 | The height of TP Pad along the y-axis direction | 0.5 | Bonding impedance |
| | B4 | From the bottom of TP Pad to the edge of the top glass | 0.05 | The precision tolerance of glass cutting is in a range of −50 μm to 50 μm. |
| Bottom glass | B5 | From the edge of the top glass to COF | 0.2 | 1. The precision of bonding and hot-pressing is in a range of −250 μm to 250 μm; 2. The distance from the edge of COF to COF Pad is in a range of −50 μm to 50 μm; 3. The precision of cutting and bonding of COF is in a range of −50 μm to 50 μm. |
| | B6 | The height of COF Pad along the y-axis direction | 0.5 | Bonding impedance |
| | B7 | From the bottom of COF Pad to the edge of the bottom glass | 0.05 | The tolerance of the precision of glass cutting is in a range of −50 μm to 50 μm. |
| | | Total | 2.1 | |

It shows that components of the bottom border are mainly divided into three areas: (1) an area between the visible area and the polarizer layer; (2) the FPC touch control driver bonding area; (3) the COF display driver bonding area. The areas (1) and (2) are disposed at the top glass and the area (3) is disposed at the bottom glass. In the examples 1 and 2 of the prior art, the bottom border requires large space since the bottom border includes the three areas stacked.

SUMMARY

In one embodiment of the present disclosure, a touch control display panel is provided, the touch control display panel includes a display area and a border area, wherein the border area is extended along a first direction, and the border area and the display area are arranged along a second direction perpendicular to the first direction; wherein the border area includes a flexible-printed-circuit (FPC) touch control driver bonding area and a chip-on-film (COF) display driver bonding area, wherein the FPC touch control driver bonding area and the COF display driver bonding area are arranged along the first direction.

In another embodiment of the present disclosure, a display device is provided, the display device includes a touch control display panel, wherein the touch control display panel includes: a display area and a border area, wherein the border area is extended along a first direction, and the border area and the display area are arranged along a second direction perpendicular to the first direction; wherein the border area includes a flexible-printed-circuit (FPC) touch control driver bonding area and a chip-on-film (COF) display driver bonding area, wherein the FPC touch control driver bonding area and the COF display driver bonding area are arranged along the first direction.

In another embodiment of the present disclosure, a method of fabricating a touch control display panel is provided, the method includes steps of: providing a first substrate including a display area carrying portion and a border area carrying portion, wherein the border area carrying portion extends along a first direction, and the display area carrying portion and the border area carrying portion are arranged along a second direction perpendicular to the first direction; forming a light emitting device layer on a side of the display area carrying portion; forming a COF display driver bonding area on a side of the border area carrying portion; forming a second substrate on a side, away from the first substrate, of the light emitting device layer, wherein the second substrate includes an opening corresponding to the COF display driver bonding area; forming a touch sensing layer and a FPC touch control driver bonding area on a side, away from the light emitting device layer, of the second substrate, wherein the FPC touch control driver bonding area and the opening are arranged along the first direction.

BRIEF DESCRIPTION OF THE DRAWINGS

Embodiments of the present disclosure will now be described, by way of example only, with reference to the accompanying schematic drawings in which corresponding reference symbols indicate corresponding parts, and in which.

DETAILED DESCRIPTION

In the following, embodiments of the present disclosure will be described in detail referring to figures. The concept and its realizations of the present disclosure can be implemented in a plurality of forms, and should not be understood to be limited to the embodiments described hereafter. In contrary, these embodiments are provided to make the present disclosure more comprehensive and understandable, and so the conception of the embodiments can be conveyed to the technicians in the art fully. Same reference signs in the figures refer to same or similar structures, so repeated description of them will be omitted.

The features, structures or characteristics described can be combined in any appropriate way in one or more embodiments. In the description below, many specific details are provided to explain the embodiments of the present disclosure fully. However, the technicians in the art should realize that, without one or more of the specific details, or adopting other methods, components, materials etc., the technical proposal of the present disclosure can still be realized. In certain conditions, structures, materials or operations well known are not shown or described in detail so as not to obfuscate the present disclosure. The technical contents of the present disclosure will be further described below with reference to the figures and embodiments. It should be stated that a plurality of embodiments described below along with their combinations and varieties, beyond doubt are within the scope of the present disclosure.

In order to solve the technical problems mentioned above, the FPC touch control driver bonding area and the COF display driver bonding area are arranged side by side in the present disclosure in order to reach the goal of a narrowest bottom border.

Based on this, the present disclosure provides an on-cell touch control AMOLED display panel, including a display area and a border area, wherein the border area is extended along a first direction, and the border area and the display area are arranged along a second direction. The border area includes an FPC touch control driver bonding area and a COF display driver bonding area, and the FPC touch control driver bonding area and the COF display driver bonding area are arranged along the first direction.

The on-cell touch control AMOLED display panel of the present disclosure will be described below with some embodiments.

Embodiment 1

Figure 1:
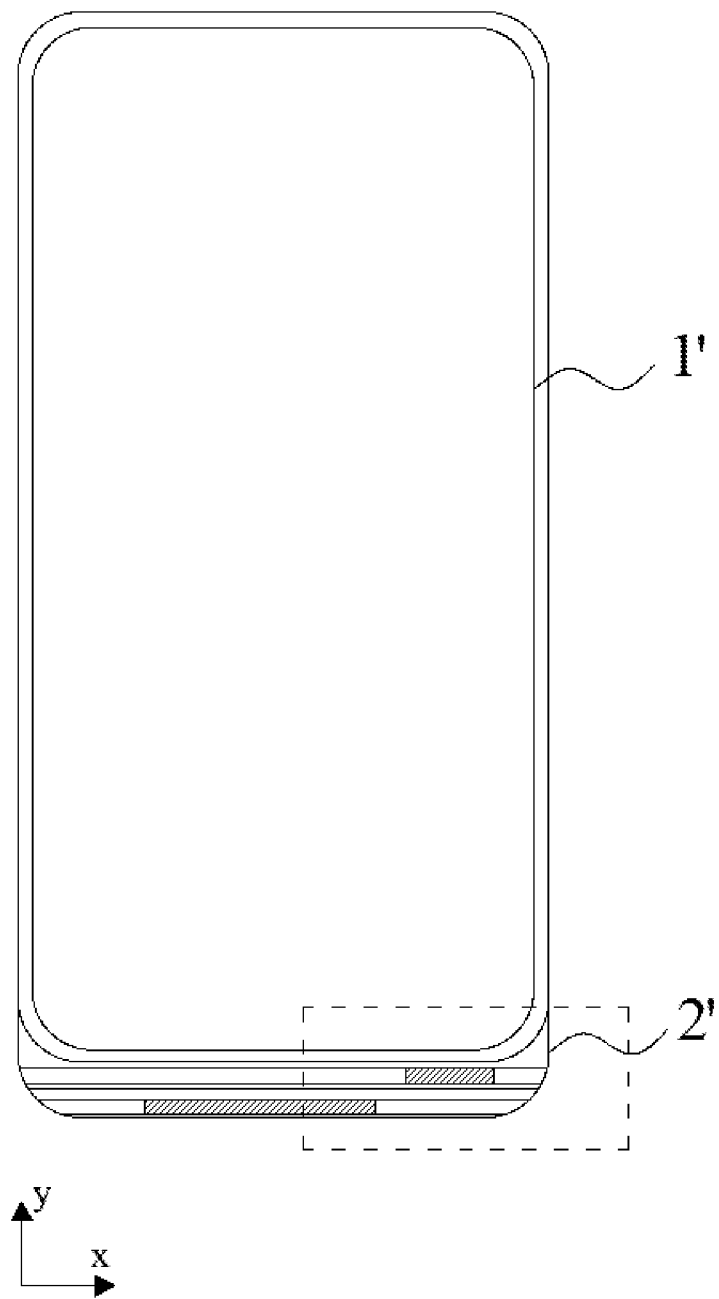
FIG. 1 shows a schematic view of a mobile phone panel of example 1 of the prior art.
Figure 2:
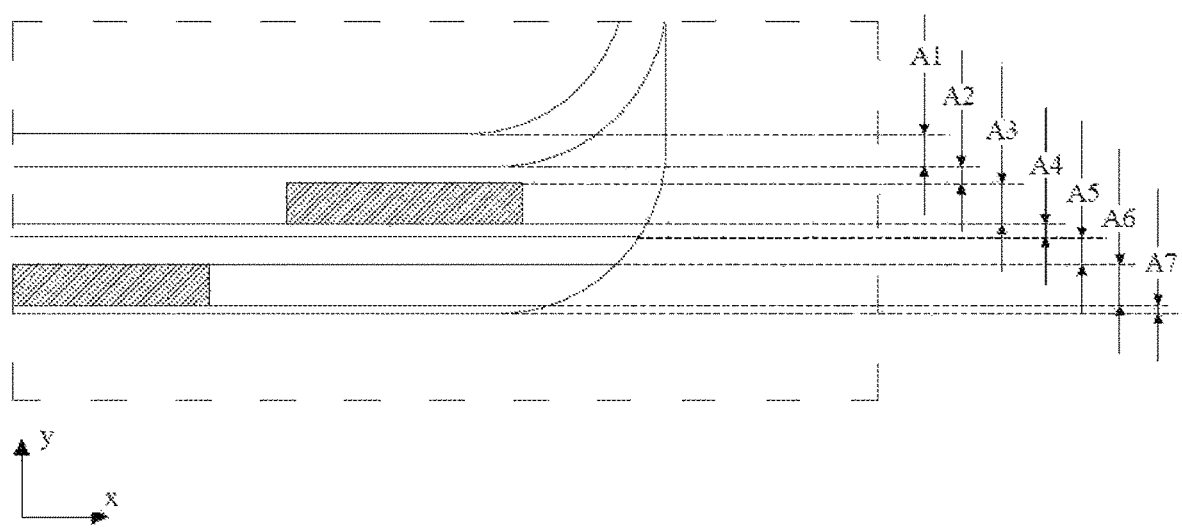
FIG. 2 shows an enlarged view of an area enclosed in the rectangular frame depicted by dotted lines in FIG. 1.
Figure 3:
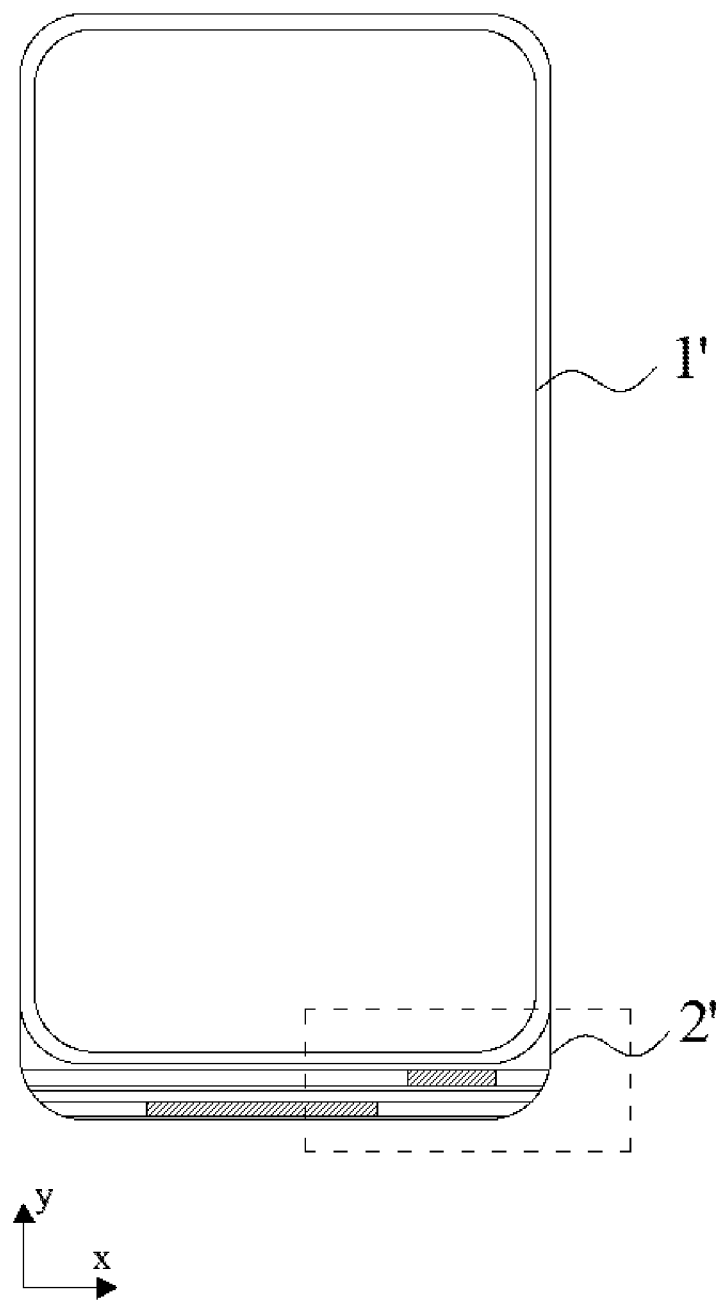
FIG. 3 shows a schematic view of a mobile phone panel of example 2 of the prior art.
Figure 4:
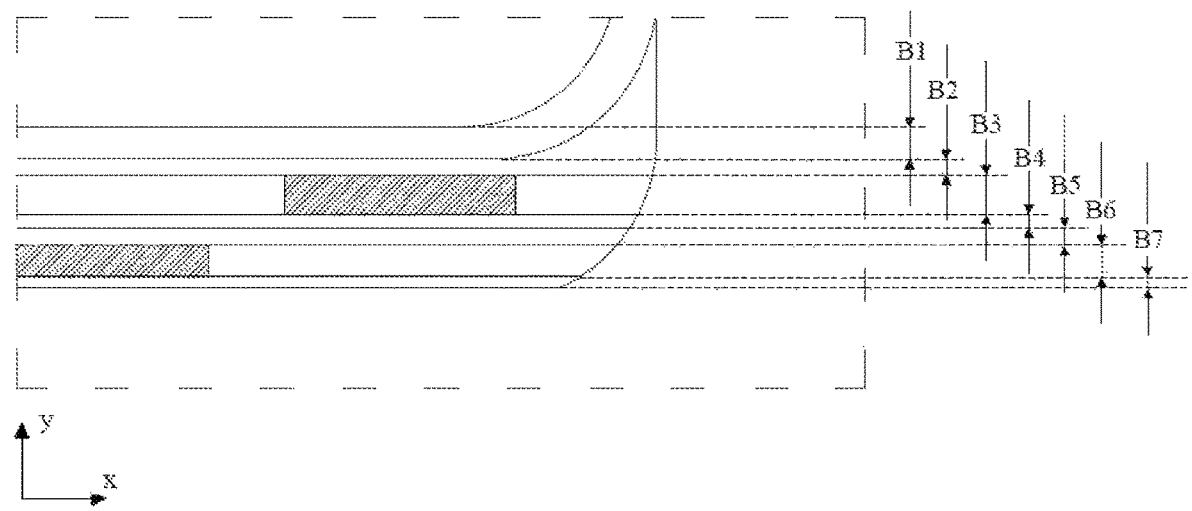
FIG. 4 shows an enlarged view of an area enclosed in the rectangular frame depicted by dotted lines in FIG. 3.
Figure 5:
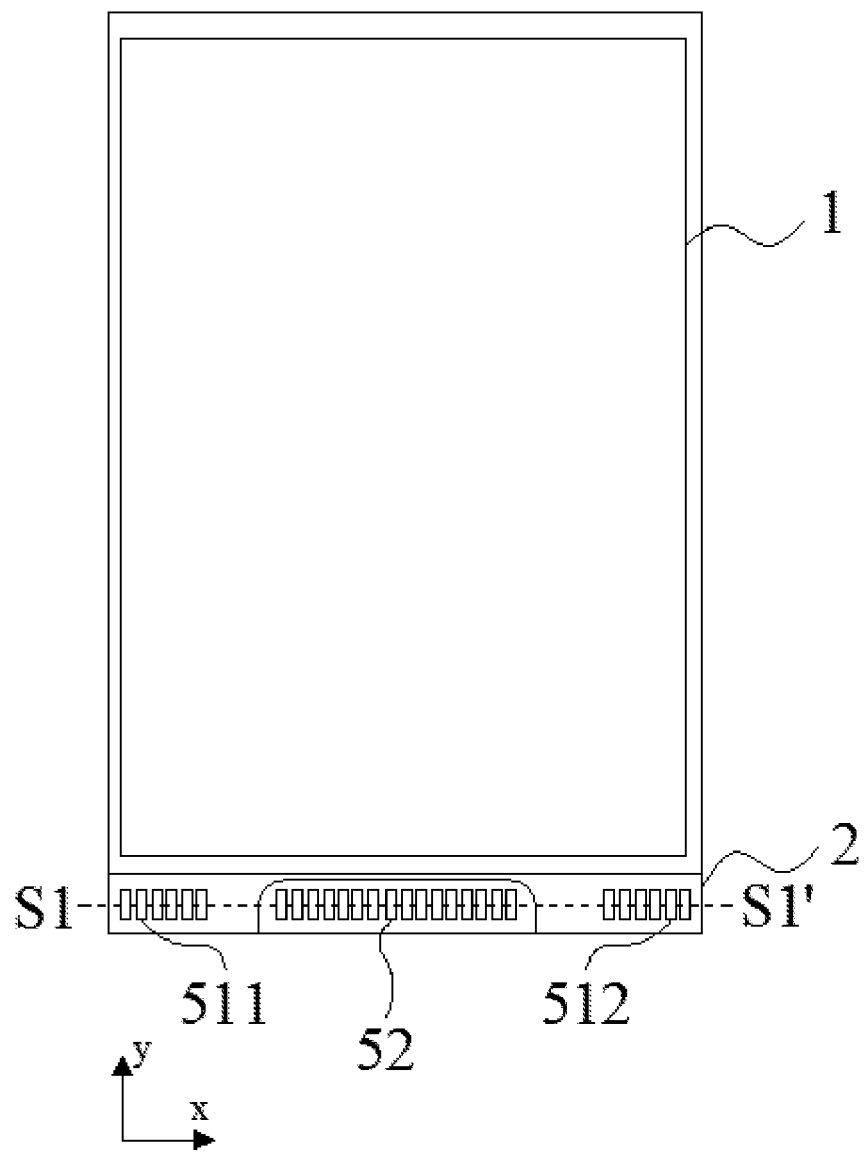
FIG. 5 shows a schematic view of a display panel of one embodiment of the present disclosure.

FIGS. 5 to 8 show schematic views of the on-cell touch control AMOLED display panel and a mobile phone panel having the touch control display panel in one embodiment of the present disclosure. As shown in FIG. 5, in this embodiment, the touch control display panel includes a display area 1 and a border area 2, wherein the border area 2 is extended along the x-axis direction. As shown in FIG. 5, the border area 2 and the display area 1 are arranged along the y-axis direction. The border area 2 includes an FPC touch control driver bonding area 51 and a COF display driver bonding area 52. The FPC touch control driver bonding area 51 includes a first FPC touch control driver bonding area 511 and a second FPC touch control driver bonding area 512. The COF display driver bonding area 52 is disposed between the first FPC touch control driver bonding area 511 and the second FPC touch control driver bonding area 512.

Figure 6:
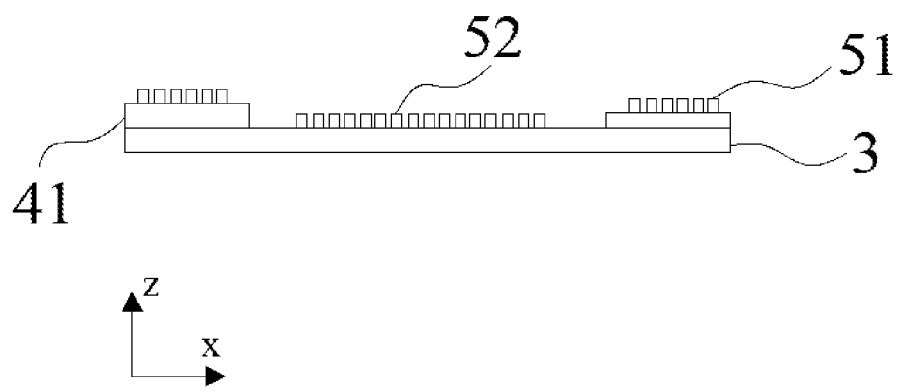
FIG. 6 shows a cross-sectional view along the S1-S1' direction depicted by dotted lines in FIG. 5.

In this embodiment, the touch control display panel includes a first substrate, a light emitting device layer, the COF display driver bonding area, a second substrate, a touch sensing layer, the FPC touch control driver bonding area and a polarizer layer arranged along a light emitting direction, the z-axis direction in FIG. 6. The first substrate is the bottom glass. The light emitting device layer and the COF display driver bonding area are disposed at a side of the first substrate. The second substrate is the top glass, and is disposed at a side, away from the first substrate, of the light emitting device layer. The touch sensing layer and the FPC touch control driver bonding area are disposed at a side, away from the light emitting device layer, of the second substrate. The polarizer layer is disposed at a side, away from the second substrate, of the touch sensing layer.

The cross-sectional view along the S1-S1' direction of FIG. 6 shows structures of the bottom glass 3 and the top glass 41, the bottom glass 3 and the top glass 41 are arranged along the light emitting direction of the touch control display panel, that is, along the z-axis direction in FIG. 6. The FPC touch control driver bonding area 51 is disposed at the top glass 41, and the COF display driver bonding area 52 is disposed at the bottom glass 3.

As shown in FIGS. 5 and 6, the top glass 41 includes an opening formed corresponding to the COF display driver bonding area 52, and in this embodiment, the opening is formed at the middle of the border of the top glass 41, and two FPC touch control driver bonding areas 51 are disposed respectively at two ends of the border of the top glass 41. The opening ensures that the basic function of the COF display driver bonding area 52 will not be affected by side-by-side arrangement of the FPC touch control driver bonding areas 51 and the COF display driver bonding area 52. The opening of the top glass 41 can be formed by irregularly-cutting.

Figure 7:
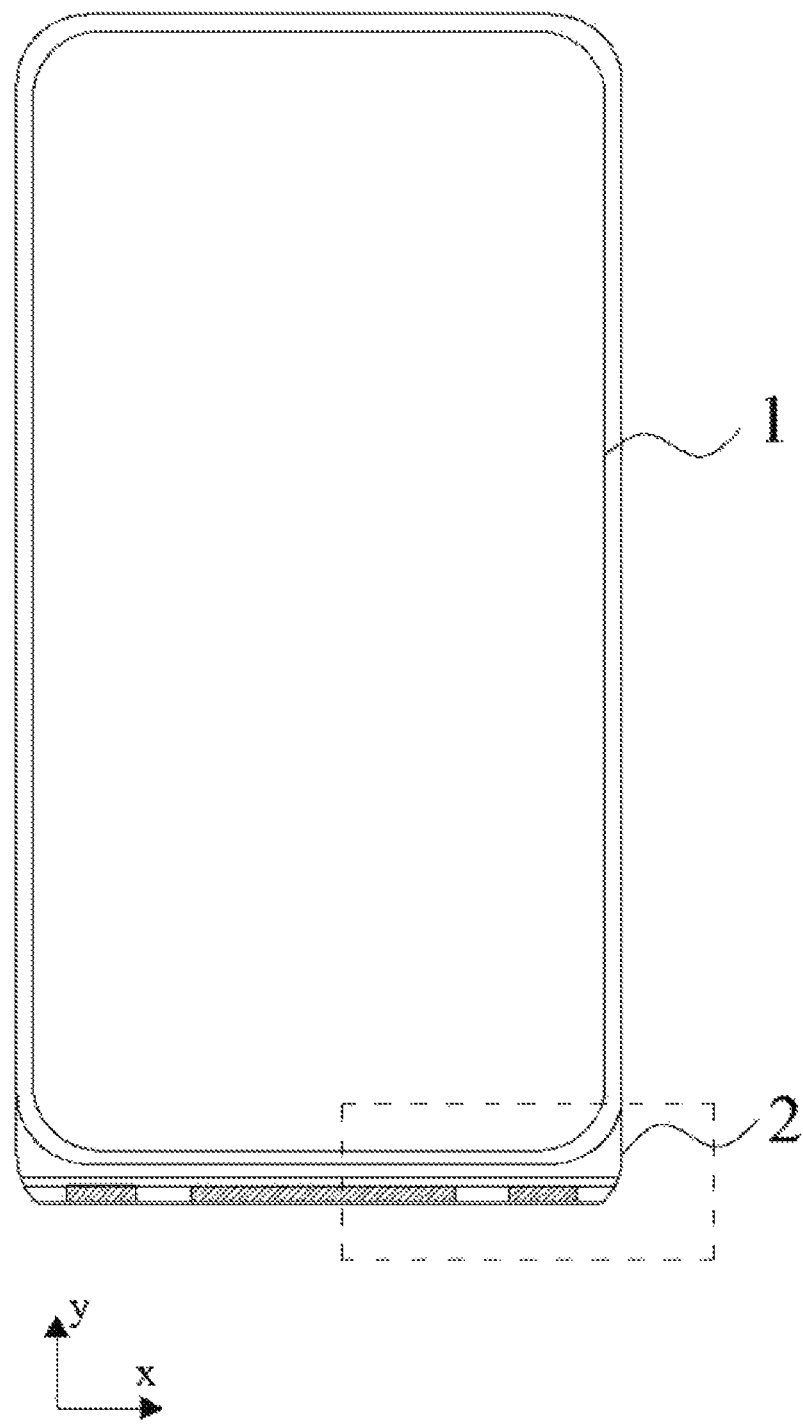
FIG. 7 shows a schematic view of a mobile phone panel of one embodiment of the present disclosure.
Figure 8:
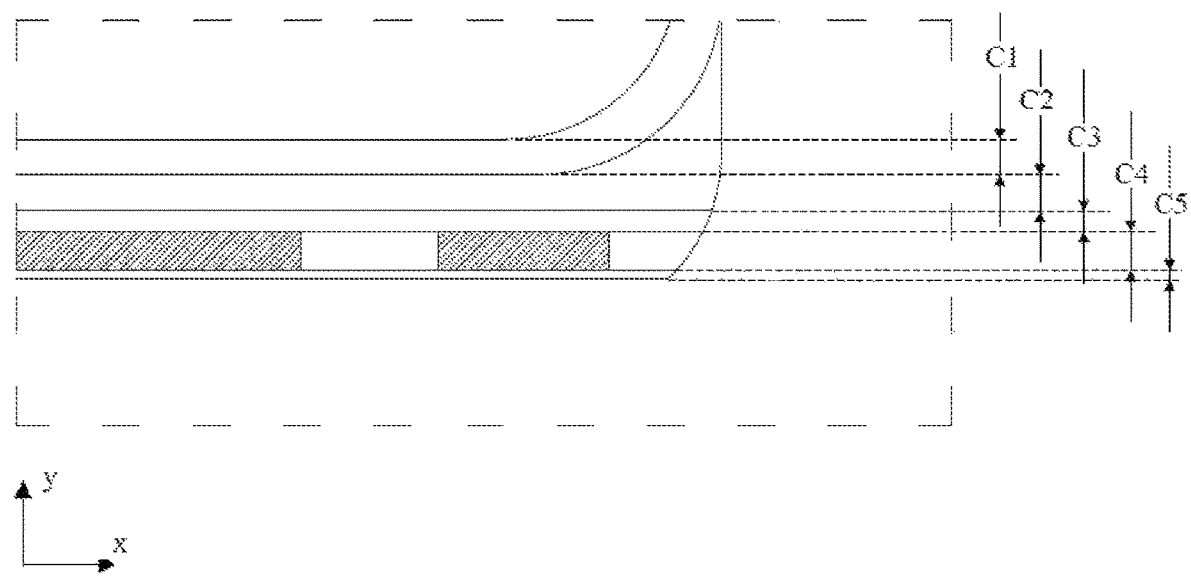
FIG. 8 shows an enlarged view of an area enclosed in the rectangular frame depicted by dotted lines in FIG. 7.

With reference of FIGS. 7 and 8, components of the bottom border of this embodiment are shown in table 3.

TABLE 3

(components of the bottom border of embodiment 1):

| | | Components of the bottom border | mm | Main limitations |
|---|---|---|---|---|
| Top glass | C1 | From AA to the edge of POL | 0.5 | 1. The precision of cutting and filming of POL is in a range of −200 μm to 200 μm; 2. POL extends out of AA in a range of −300 μm to 300 μm |
| | C2 | From the edge of POL to the edge of the top glass | 0.53 | 1. The width of Frit pasting is 500 μm; 3. The width of panel wiring is 30 μm. |
| Bottom glass | C3 | From the edge of the top glass to COF | 0.2 | 1. The precision of bonding and hot-pressing is in a range of −100 μm to 100 μm; 2. The distance from the edge of COF to COF Pad is in a range of −50 μm to 50 μm; 3. The precision of cutting and bonding of COF is in a range of −50 μm to 50 μm. |
| | C4 | The height of COF Pad along the y-axis direction | 0.5 | Bonding impedance |
| | C5 | From the bottom of COF Pad to the edge of the bottom glass | 0.05 | The precision tolerance of glass cutting is in a range of −50 μm to 50 μm. |
| | | Total | 1.78 | |

As shown in table 3, in this embodiment, the total width of the bottom border is 1.78 mm, which is greatly reduced compared with the width of the bottom border in the prior art.

Embodiment 2

Figure 9:
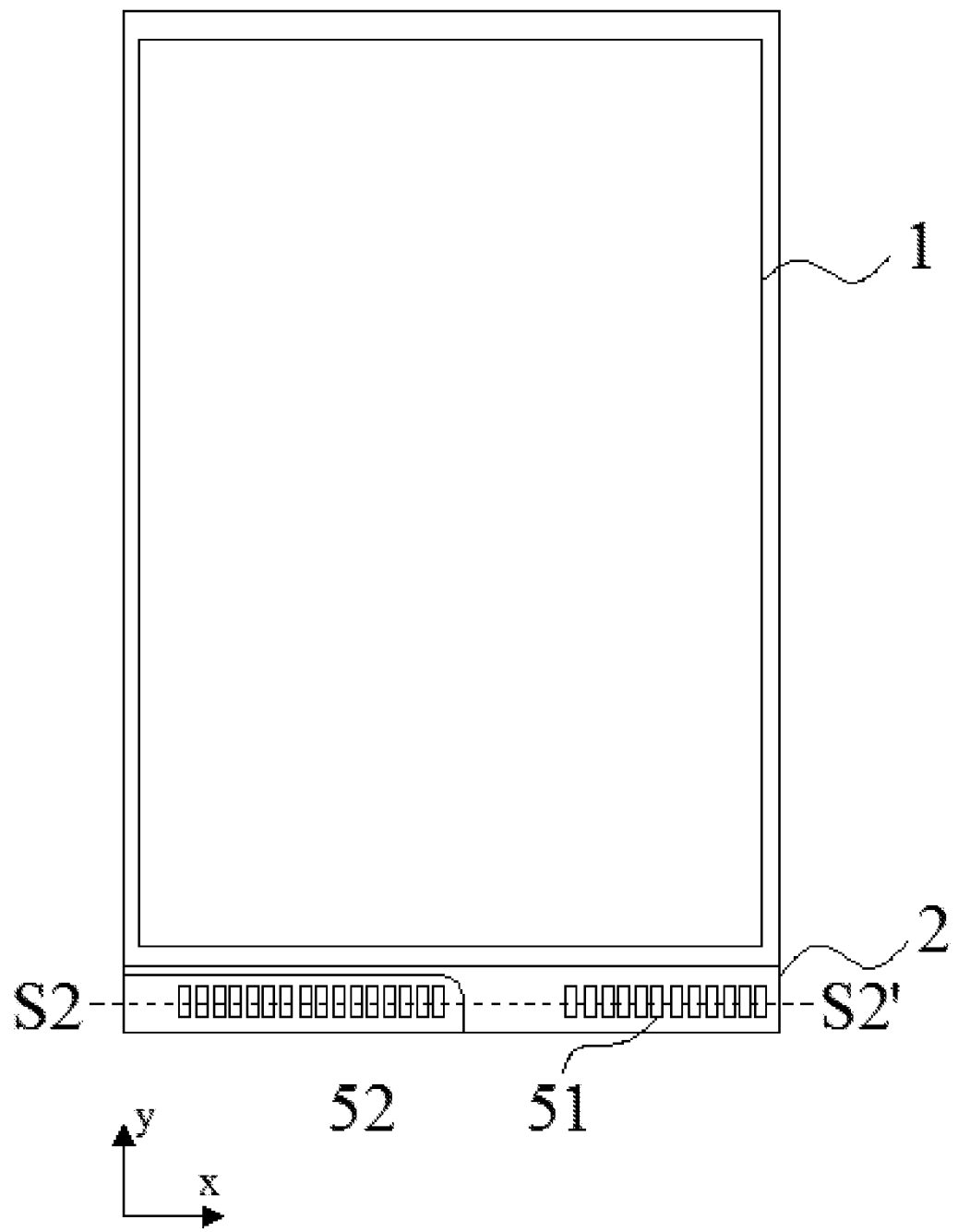
FIG. 9 shows a schematic view of a display panel of one embodiment of the present disclosure.

FIGS. 9 to 12 show schematic views of the touch control display panel and a mobile phone panel having the touch control display panel of one embodiment of the present disclosure. As shown in FIG. 9, in this embodiment, the touch control display panel includes a display area 1 and a border area 2, the border area 2 is extended along the x-axis direction. The border area 2 and the display area 1 are arranged along the y-axis direction. The border area 2 includes an FPC touch control driver bonding area 51 and a COF display driver bonding area 52. In this embodiment, the FPC touch control driver bonding area 51 is disposed at a first end of the bottom border, and the COF display driver bonding area 52 is disposed at a second end of the bottom border.

Figure 10:
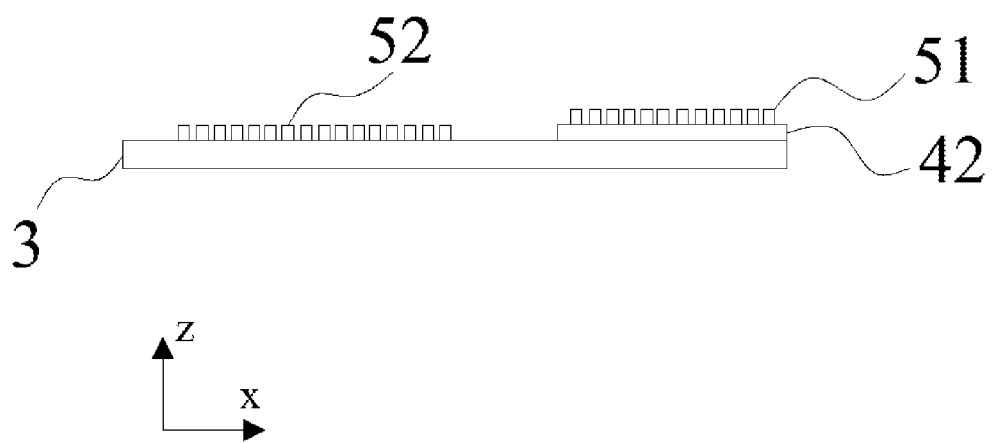
FIG. 10 shows a cross-sectional view along the S2-S2' direction depicted by dotted lines in FIG. 9.

In this embodiment, similarly, the touch control display panel includes a first substrate, a light emitting device layer, the COF display driver bonding area, a second substrate, a touch sensing layer, the FPC touch control driver bonding area and a polarizer layer arranged along the light emitting direction, the z-axis direction in FIG. 10. The first substrate is the bottom glass. The light emitting device layer and the COF display driver bonding area are disposed at a side of the first substrate. The second substrate is the top glass, and is disposed at a side, away from the first substrate, of the light emitting device layer; the touch sensing layer and the FPC touch control driver bonding area are disposed at a side, away from the light emitting device layer, of the second substrate; and the polarizer layer is disposed at a side, away from the second substrate, of the touch sensing layer.

The cross-sectional view along the S2-S2' direction of FIG. 10 shows structures of the bottom glass 3 and the top glass 42, the bottom glass 3 and the top glass 42 are arranged along the light emitting direction of the touch control display panel, that is, along the z-axis direction in the FIG. 10. The FPC touch control driver bonding areas 51 is disposed at the top glass 42, and the COF display driver bonding area 52 is disposed at the bottom glass 3.

As shown in FIGS. 9 and 10, the top glass 42 includes an opening formed corresponding to the COF display driver bonding area 52. In this embodiment, the opening is formed at one end of the border of the top glass 42, and the FPC touch control driver bonding area 51 is disposed at the other end of the border of the top glass 42. The opening ensures that the basic function of the COF display driver bonding area 52 will not be affected by side-by-side arrangement of the FPC touch control driver bonding areas 51 and the COF display driver bonding area 52. The opening of the top glass 42 is formed by irregularly-cutting.

Figure 11:
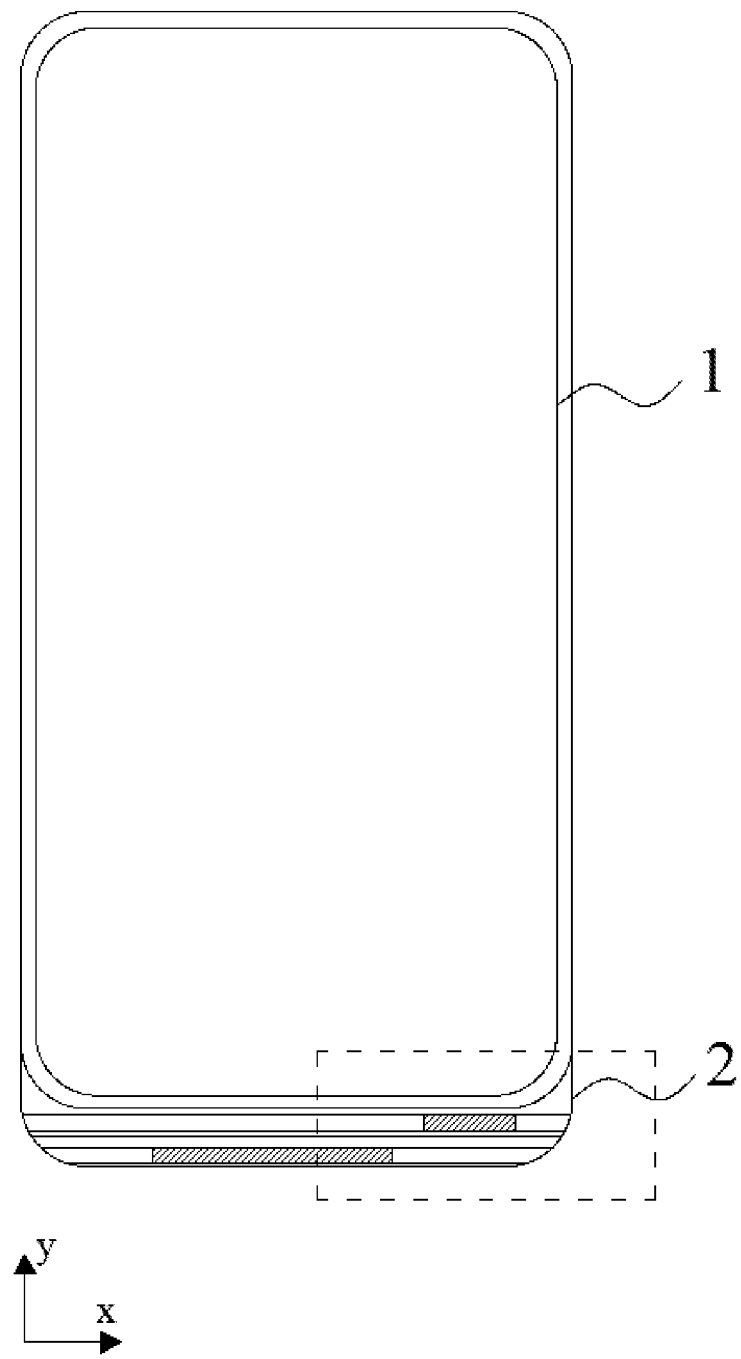
FIG. 11 shows a schematic view of a mobile phone panel of one embodiment of the present disclosure.
Figure 12:
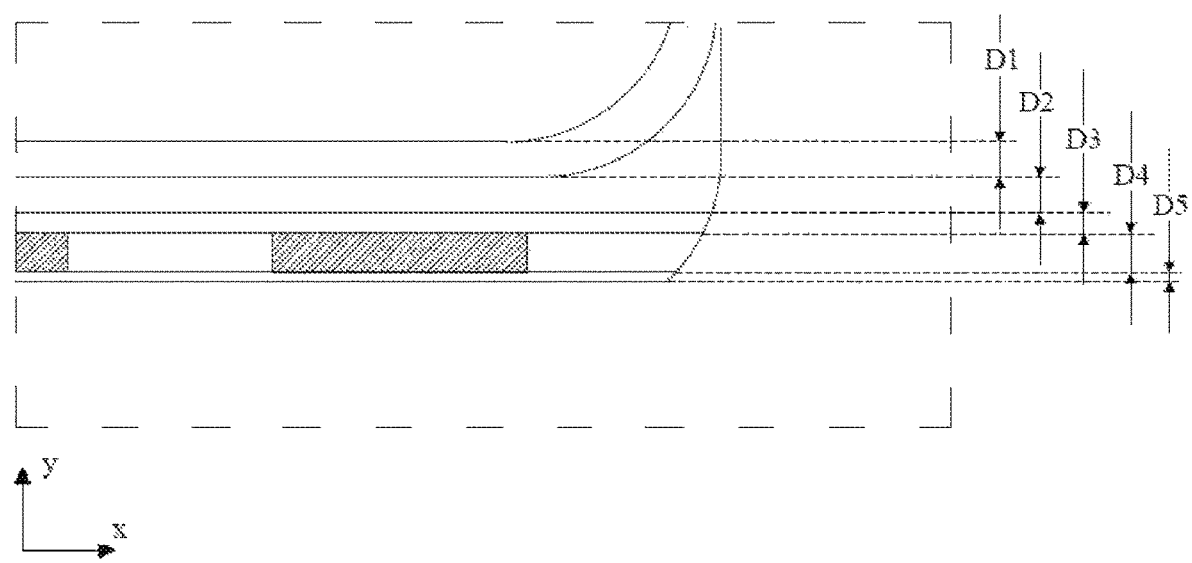
FIG. 12 shows an enlarged view of a area enclosed in the rectangular frame depicted by dotted lines in FIG. 11.

With references of FIGS. 11 and 12, components of the bottom border of this embodiment are shown in table 4.

TABLE 4

(components of the bottom border of embodiment 2)

| | | Components of the bottom border | mm | Main limitations |
|---|---|---|---|---|
| Top glass | D1 | From AA to the edge of POL | 0.5 | 1. The precision of cutting and filming of POL is in a range of between −200 μm to 200 μm; 2. POL extends out of AA in a range of −300 μm to 300 μm |
| | D2 | From the edge of POL to the edge of the top glass | 0.63 | 1. The width of Frit pasting is 500 μm; 3. The width of panel wiring is 130 μm. |
| Bottom glass | D3 | From the edge of the top glass to COF | 0.2 | 1. The precision of bonding and hot-pressing is in a range of −100 μm to 100 μm; |

TABLE 4-continued (components of the bottom border of embodiment 2)

| Components of the bottom border | | mm | Main limitations |
|---|---|---|---|
| | | | 2. The distance from the edge of COF to COF Pad is in a range of −50 μm to 50 μm; |
| | | | 3. The precision of cutting and bonding of COF is in a range of −50 μm to 50 μm. |
| D4 | The height of COF Pad along the y-axis direction | 0.5 | Bonding impedance |
| D5 | From the bottom of COF Pad to the edge of the bottom glass | 0.05 | The precision tolerance of glass cutting is in a range of −50 μm to 50 μm. |
| | Total | 1.88 | |

As shown in table 4, in this embodiment, the total width of the bottom border is 1.88 mm, which is greatly reduced compared with the width of the bottom border in the prior art.

The above embodiments 1 and 2 describe two dispositions of the border area. Other dispositions can be applied in practical application, as long as the FPC touch control driver bonding areas and the COF display driver bonding area are disposed side by side, such that the purpose of reducing the width of the border area of the present disclosure is achieved. In addition, the border area is taken as an example in embodiments 1 and 2, but the present disclosure is not limited to this. The FPC touch control driver bonding areas and the COF display driver bonding area are also be disposed at the top border, the left border or the right border Therefore, the purpose of reducing the width of the border area on the basis of ensuring the basic function of the touch control display panel is the achieved.

Furthermore, for the touch control display panel including the first substrate and the second substrate, the COF display driver bonding area is disposed between the first substrate and the second substrate. The FPC touch control driver bonding area is disposed at a side, away from the first substrate, of the second substrate; and the second substrate includes an opening formed corresponding to the COF display driver bonding area. The purpose of the present disclosure is achieved as long as a vertical projection projected on the first substrate of the opening of the second substrate covers the COF display driver bonding area. Specific position and quantity of the opening are not limited, as long as the opening is formed corresponding to the COF display driver bonding area and the function of the COF display driver bonding area is achieved.

Therefore, the border area includes a first spacer, a second spacer, a third spacer, the COF display driver bonding area and a fourth spacer are arranged along the y-axis direction. The first spacer is disposed between an outer edge of the light emitting device layer and an outer edge of the polarizer layer, e.g. C1 described in embodiment 1 or D1 described in embodiment 2. The second spacer is disposed between the outer edge of the polarizer layer and an inner edge of the opening of the second substrate, e.g. C2 described in embodiment 1 or as D2 described in embodiment 2. The third spacer is disposed between the inner edge of the opening of the second substrate and an inner edge of the COF display driver bonding area, e.g. C3 described in embodiment 1 or D3 described in embodiment 2. The COF display driver bonding area is C4 described in embodiment 1 or D4 described in embodiment 2. The fourth spacer is disposed between an outer edge of the COF display driver bonding area and an outer edge of the first substrate, e.g. C5 described in embodiment 1 or D5 described in embodiment 2.

Embodiment 3

Figure 13:
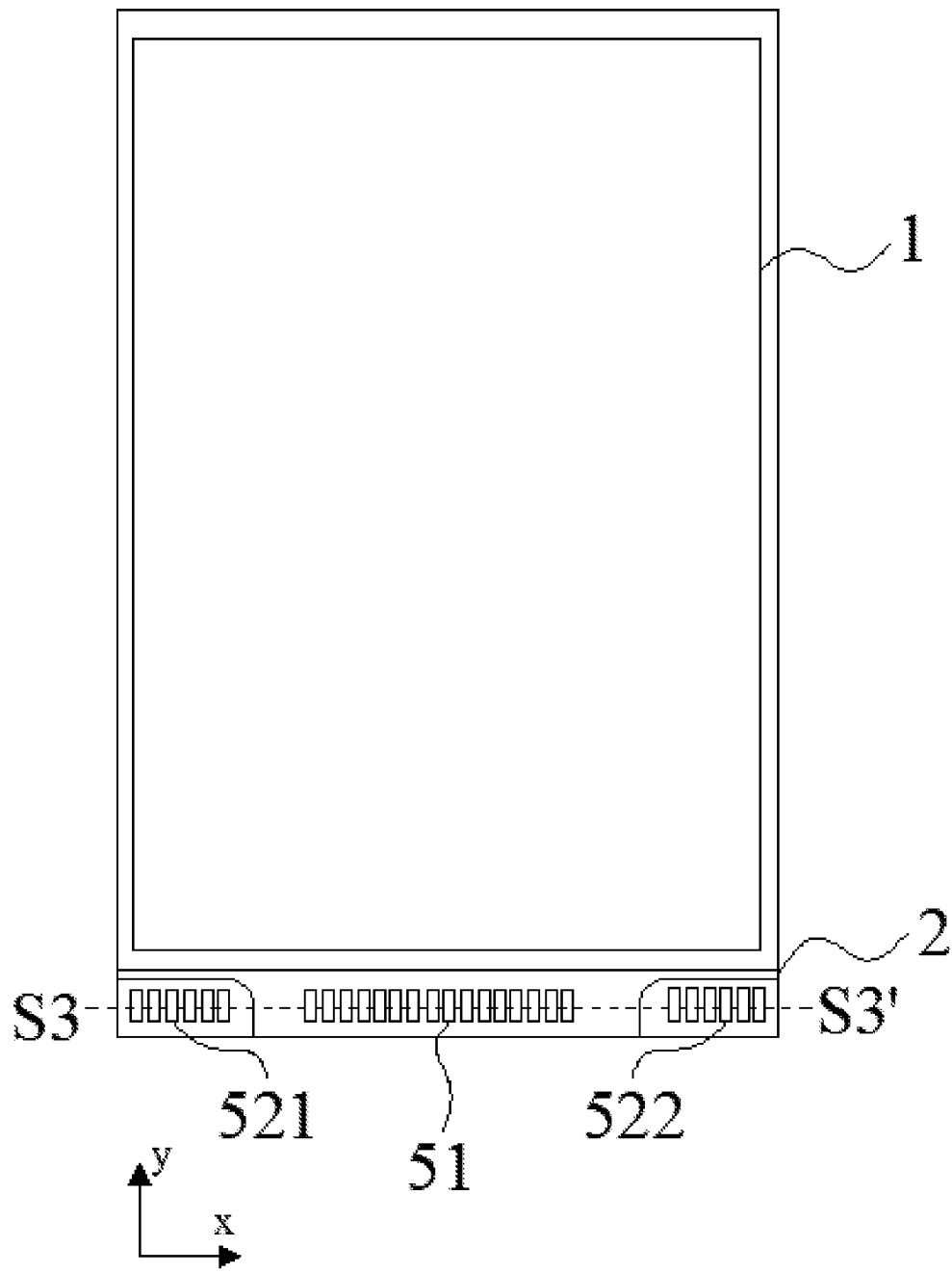
FIG. 13 shows a schematic view of a display panel of one embodiment of the present disclosure.
Figure 14:
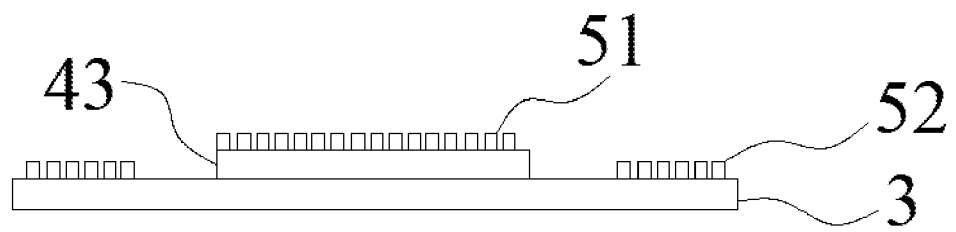
FIG. 14 shows a cross-sectional view along the S3-S3' direction depicted by dotted lines in FIG. 13.

FIGS. 13 and 14 show schematic views of the touch control display panel and a mobile phone panel having the touch control display panel according to one embodiment of the present disclosure. As shown in FIG. 13, in this embodiment, the touch control display panel includes a display area 1 and a border area 2, the border area 2 is extended along the x-axis direction as shown in FIG. 13, and the border area 2 and the display area 1 are arranged along the y-axis direction. The border area 2 includes an FPC touch control driver bonding area 51 and a COF display driver bonding area 52. In this embodiment, the COF display driver bonding area 52 includes a first COF display driver bonding area 521 and a second COF display driver bonding area 522, and the FPC touch control driver bonding area 51 is disposed between the first COF display driver bonding area 521 and the second COF display driver bonding area 522.

In this embodiment, similarly, the touch control display panel includes a first substrate, a light emitting device layer, the COF display driver bonding area, a second substrate, a touch sensing layer, the FPC touch control driver bonding area and a polarizer layer arranged along the light emitting direction, the z-axis direction. The first substrate is the bottom glass. The light emitting device layer and the COF display driver bonding area are disposed at a side of the first substrate. The second substrate is the top glass disposed at a side, away from the first substrate, of the light emitting device layer; the touch sensing layer and the FPC touch control driver bonding area are disposed at a side, away from the light emitting device layer, of the second substrate. The polarizer layer is disposed at a side, away from the second substrate, of the touch sensing layer.

The cross-sectional view along the S3-S3' direction of FIG. 14 shows structures of the bottom glass 3 and the top glass 43, the bottom glass 3 and the top glass 43 arranged along the light emitting direction, the z-axis direction shown in FIG. 14, of the touch control display panel. The FPC touch control driver bonding areas 51 is disposed at the top glass 43, and the COF display driver bonding area 52 is disposed at the bottom glass 3.

As shown in FIGS. 13 and 14, the top glass 43 includes two openings respectively formed at two ends thereof corresponding to the COF display driver bonding area 52. The FPC touch control driver bonding area 51 is disposed at the middle of the two openings. The openings ensure that the basic function of the COF display driver bonding area 52 will not be affected by side-by-side arrangement of the FPC touch control driver bonding areas 51 and the COF display driver bonding area 52. The two openings of the top glass 43 can be formed by irregularly-cutting.

In this embodiment, the width of the bottom border along the y-axis direction is similar to the width of the bottom border along the y-axis direction of embodiment 1. The total width of the bottom border is greatly reduced benefited since the FPC touch control driver bonding area 51 and the COF display driver bonding area 52 are arranged side-by-side.

Embodiment 4

Figure 15:
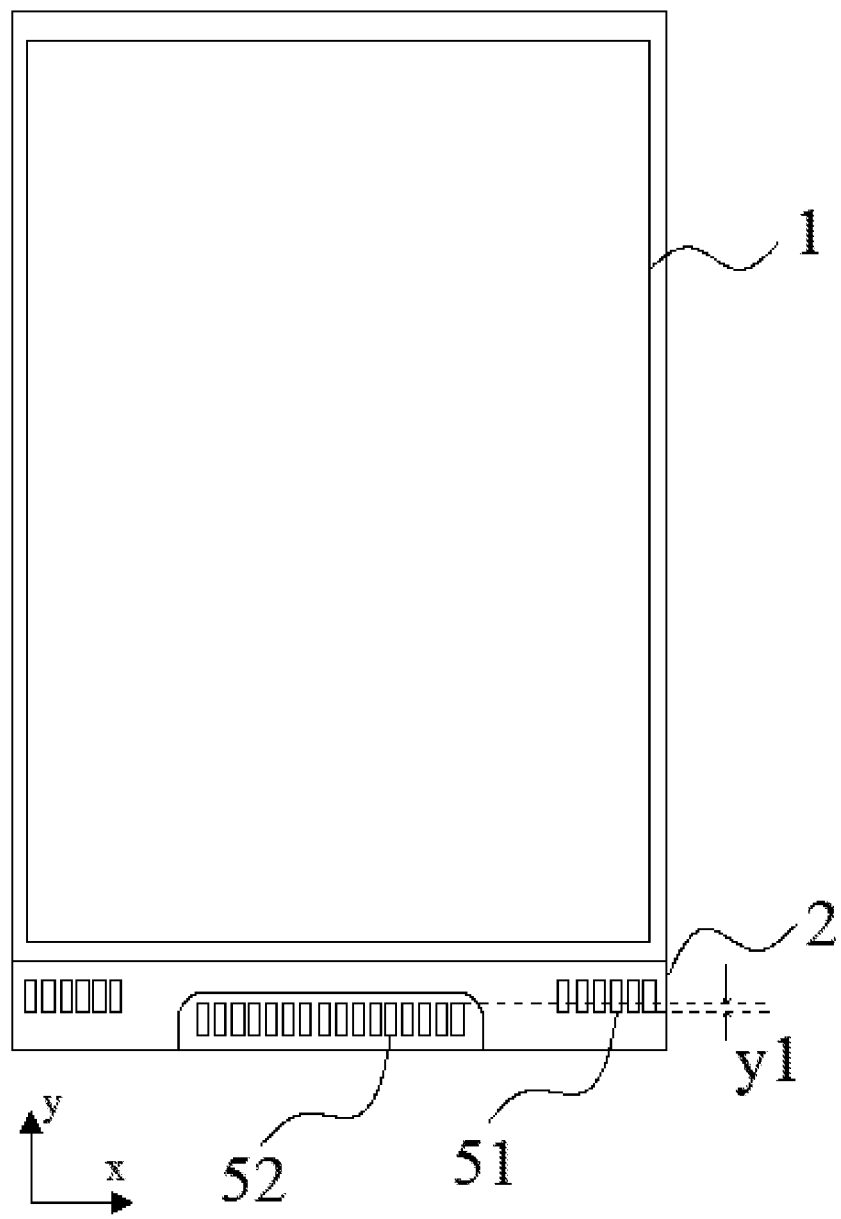
FIG. 15 shows a schematic view of a display panel of one embodiment of the present disclosure.

FIG. 15 shows a schematic view of the touch control display panel of one embodiment of the present disclosure. The FPC touch control driver bonding area 51 and the COF display driver bonding area 52 are disposed side by side, which means the FPC touch control driver bonding area 51 and the COF display driver bonding area 52 are arranged along the x-axis direction in the above embodiments 1 to 3. However, in embodiment 4, the FPC touch control driver bonding area 51 and the COF display driver bonding area 52 are arranged side by side, and are not completely overlapped along the y-axis direction. However, at least an overlapping area y1 of the FPC touch control driver bonding area 51 and the COF display driver bonding area 52 is existed. That is, the projection, projected on a first reference plane of the FPC touch control driver bonding area 51 is partially overlapped on the projection, projected on the first reference plane of the COF display driver bonding area 52. The first reference plane is orthogonal to the x-axis direction and is parallel to the y-axis direction, which means a plane including the y-axis direction and the z-axis direction. The COF display driver bonding area 52 can be lower than the FPC touch control driver bonding area 51. In this embodiment, the width of the bottom border along the y-axis direction is similar to the width of the bottom border of embodiment 1. Since the overlapping area along the y-axis direction of the FPC touch control driver bonding area 51 and the COF display driver bonding area 52 is smaller than, the overlapping area along the y-axis direction of the FPC touch control driver bonding area 51 and the COF display driver bonding area 52 of embodiment 1, the width of the bottom border is larger than the width of the bottom border of embodiment 1 but smaller than the width of the bottom border of the prior art.

Embodiment 5

Figure 16:
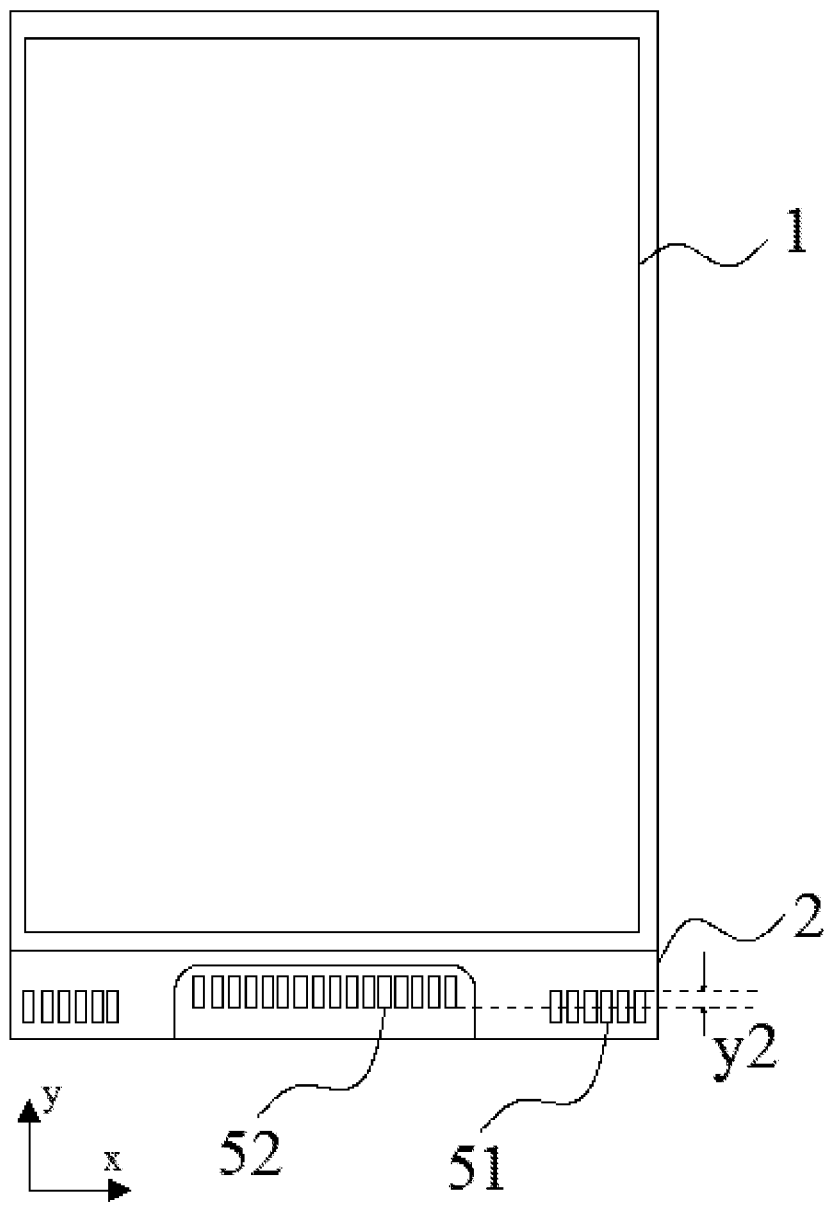
FIG. 16 shows a schematic view of a display panel of one embodiment of the present disclosure.

FIG. 16 shows a schematic view of the touch control display panel according to embodiment 5 of the present disclosure. Similar to embodiment 4, the FPC touch control driver bonding area 51 and the COF display driver bonding area 52 are arranged side by side, and are not completely overlapped along the y-axis direction. However, at least an overlapping area y2 of the FPC touch control driver bonding area 51 and the COF display driver bonding area 52 is existed. That is, the projection, projected on the first reference plane of the FPC touch control driver bonding area 51, is partially overlapped on the projection projected on the first reference plane of the COF display driver bonding area 52. The first reference plane is orthogonal to the x-axis direction and is parallel to the y-axis direction, which means a plane including the y-axis direction and the z-axis direction. The FPC touch control driver bonding area 51 is lower than the COF display driver bonding area 52. In this embodiment, the width of the bottom border along the y-axis direction is similar to that of embodiment 1. Since the overlapping area along the y-axis direction of the FPC touch control driver bonding area 51 and the COF display driver bonding area 52 is smaller than, the overlapping area along the y-axis direction of the FPC touch control driver bonding area 51 and the COF display driver bonding area 52, the width of the bottom border is larger than the width of the bottom border may be larger of embodiment 1 but smaller than the width of the bottom border of the prior art.

In some embodiments, the two FPC touch control driver bonding areas 51 in FIGS. 15 and 16 are combined into one. The COF display driver bonding area 52, in some embodiments, is divided into two portions and the portions are arranged along the x-axis direction. These embodiments are all within the scope of protection of the present disclosure.

The present disclosure also provides a display device including the on-cell touch control AMOLED display panel. The display device of the present disclosure includes a mobile phone having the touch control display panel, a computer display screen, an integrated device, a tablet computer, and the like having the touch control display panel. Once the on-cell touch control AMOLED display panel of the present disclosure is used, the border width of the display device is greatly reduced and the narrow border design is then achieved. Therefore, the expectations of narrow border and full screen of the current market are then meet as well.

Figure 17:
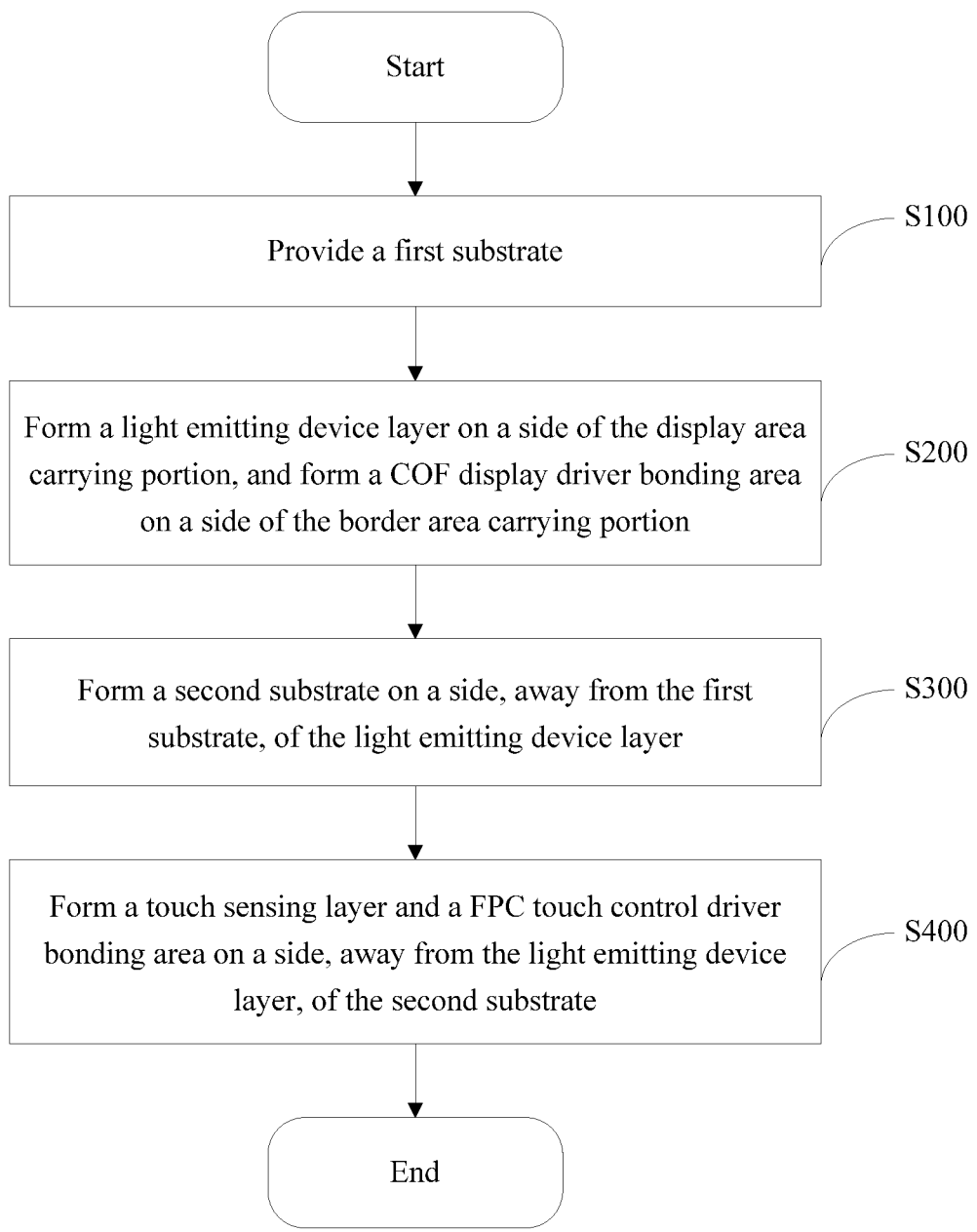
FIG. 17 shows a flowchart of a method of fabricating a display panel of one embodiment of the present disclosure.

As shown in FIG. 17, the present disclosure further provides a method of fabricating the on-cell touch control AMOLED display panel.

S100: a first substrate including a display area carrying portion and a border area carrying portion are provided, and the border area carrying portion extends along a first direction, and the display area carrying portion and the border area carrying portion are arranged along a second direction;

S200: a light emitting device layer is formed on a side of the display area carrying portion, and a COF display driver bonding area is formed on a side of the border area carrying portion;

S300: a second substrate is formed on a side, away from the first substrate, of the light emitting device layer, wherein an opening is formed on the second substrate by irregularly-cutting, and the opening is corresponding to the COF display driver bonding area;

S400: a touch sensing layer and a FPC touch control driver bonding area is formed on a side, away from the light emitting device layer, of the second substrate, wherein the FPC touch control driver bonding area and the opening are arranged along the first direction.

In this embodiment, the FPC touch control driver bonding area and the opening are arranged along the first direction which means an overlapping area of the FPC touch control driver bonding area and the opening is formed along the y-axis direction. The FPC touch control driver bonding area, in this embodiment, is not necessary to be aligned to the opening. That is, the projection, projected on the first reference plane of the FPC touch control driver bonding area is partially overlapped on the projection, projected on the first reference plane of the opening.

Further, a polarizer layer is formed on a side, away from the second substrate, of the touch sensing layer.

In some embodiments, the opening formed by irregularly-cutting is disposed at one end of the border of the second substrate. The COF display driver bonding area is disposed at one end of the border of the first substrate. In this embodiment, the opening formed by irregularly-cutting is disposed at the middle of the border of the second substrate, correspondingly, the COF display driver bonding area is disposed at the middle of the border of the first substrate. When the opening is formed at one end of the border of the second substrate, the FPC touch control driver bonding area is disposed at the other end of the border of the second substrate. When the opening is formed at the middle of the border of the second substrate, the FPC touch control driver bonding area includes two portions. The first FPC touch control driver bonding area and the second FPC touch control driver bonding area are disposed respectively at two ends of the border of the second substrate. When two openings are formed respectively at two ends of the border of the second substrate, the COF display driver bonding area includes two portions, the first COF display driver bonding area and the second COF display driver bonding area, and the FPC touch control driver bonding area is disposed between the first COF display driver bonding area and the second COF display driver bonding area.

Compared with the prior art, the features of the on-cell touch control AMOLED display panel, the display device and the method of fabricating the on-cell touch control AMOLED display panel of the present disclosure achieves the goal of reducing the border width of the on-cell touch control AMOLED display panel by disposing the FPC touch control driver bonding area and the COF display driver bonding area side by side. Therefore, the expectations of narrow border and full screen of the current market are then meet as well. Moreover, the present disclosure ensures the normal functions of the display panel, and has reasonable and compact layout of the display panel, by irregularly-cutting and bonding technologies, within limited space.

What is claimed is:

1. A touch control display panel comprising:
    a display area and a border area, wherein the border area is extended along a first direction, and the border area and the display area are arranged along a second direction perpendicular to the first direction;
    wherein the border area includes a flexible-printed-circuit (FPC) touch control driver bonding area and a chip-on-film (COF) display driver bonding area, wherein the FPC touch control driver bonding area and the COF display driver bonding area are arranged along the first direction; and
    a first substrate and a second substrate sequentially arranged along a light emitting direction of the touch control display panel;
    the COF display driver bonding area is disposed between the first substrate and the second substrate;
    the FPC touch control driver bonding area is disposed at a side, away from the first substrate, of the second substrate;
    wherein the second substrate includes an opening formed corresponding to the COF display driver bonding area, and a vertical projection, projected on the first substrate, of the opening covers the COF display driver bonding area.

2. The touch control display panel of claim 1, wherein a projection, projected on a first reference plane, of the FPC touch control driver bonding area is partially or completely overlapped on a projection, projected on the first reference plane, of the COF display driver bonding area, wherein the first reference plane is orthogonal to the first direction and is parallel to the second direction.

3. The touch control display panel of claim 1, wherein the FPC touch control driver bonding area includes a first FPC touch control driver bonding area and a second FPC touch control driver bonding area, the COF display driver bonding area is disposed between the first FPC touch control driver bonding area and the second FPC touch control driver bonding area.

4. The touch control display panel of claim 1, wherein the COF display driver bonding area includes a first COF display driver bonding area and a second COF display driver bonding area, the FPC touch control driver bonding area is disposed between the first COF display driver bonding area and the second COF display driver bonding area.

5. The touch control display panel of claim 1, wherein the second substrate includes a border extending along the first direction, and the opening is formed at a first end of the border, and the FPC touch control driver bonding area is disposed at a second end of the border.

6. The touch control display panel of claim 1, wherein the FPC touch control driver bonding area includes a first FPC touch control driver bonding area and a second FPC touch control driver bonding area, wherein the COF display driver bonding area is disposed between the first FPC touch control driver bonding area and the second FPC touch control driver bonding area; and
    wherein the second substrate includes a border extending along the first direction, the opening is formed at the middle of the border, and the first FPC touch control driver bonding area and the second FPC touch control driver bonding area are disposed respectively at two ends of the border.

7. The touch control display panel of claim 1, wherein the COF display driver bonding area includes a first COF display driver bonding area and a second COF display driver bonding area, the FPC touch control driver bonding area is disposed between the first COF display driver bonding area and the second COF display driver bonding area;
    the second substrate includes a border extending along the first direction and the FPC touch control driver bonding area is disposed at the middle of the border, and two openings are formed respectively at two ends of the border.

8. The touch control display panel of claim 1, wherein the first substrate, a light emitting device layer, the COF display driver bonding area, the second substrate, a touch sensing layer, the FPC touch control driver bonding area and a polarizer layer arranged alone the light emitting direction of the touch control display panel;
    wherein the light emitting device layer and the COF display driver bonding area are disposed at a side of the first substrate, and the second substrate is disposed at a side, away from the first substrate, of the light emitting device layer; wherein the touch sensing layer and the FPC touch control driver bonding area are disposed at a side, away from the light emitting device layer, of the second substrate; and
    wherein the polarizer layer is disposed at a side, away from the second substrate, of the touch sensing layer.

9. The touch control display panel of claim 8, wherein the border area includes a first spacer, a second spacer, a third spacer, the COF display driver bonding area and a fourth spacer arranged along the second direction;
    wherein the first spacer is disposed between an outer edge of the light emitting device layer and an outer edge of the polarizer layer;
    wherein the second spacer is disposed between the outer edge of the polarizer layer and an inner edge of the opening of the second substrate;
    wherein the third spacer is disposed between the inner edge of the opening of the second substrate and an inner edge of the COF display driver bonding area; and wherein the fourth spacer is disposed between an outer edge of the COF display driver bonding area and an outer edge of the first substrate.

10. A display device comprising a touch control display panel, wherein the touch control display panel comprising:
a display area and a border area, wherein the border area is extended along a first direction, and the border area and the display area are arranged along a second direction perpendicular to the first direction;
wherein the border area includes a flexible-printed-circuit (FPC) touch control driver bonding area and a chip-on-film (COF) display driver bonding area, wherein the FPC touch control driver bonding area and the COF display driver bonding area are arranged along the first direction; and
a first substrate and a second substrate sequentially arranged along a light emitting direction of the touch control display panel;
the COF display driver bonding area is disposed between the first substrate and the second substrate;
the FPC touch control driver bonding area is disposed at a side, away from the first substrate, of the second substrate;
wherein the second substrate includes an opening formed corresponding to the COF display driver bonding area, and a vertical projection, projected on the first substrate, of the opening covers the COF display driver bonding area.

11. The display device of claim 10, wherein a projection, projected on a first reference plane, of the FPC touch control driver bonding area is partially or completely overlapped on a projection, projected on the first reference plane, of the COF display driver bonding area, wherein the first reference plane is orthogonal to the first direction and is parallel to the second direction.

12. The display device of claim 10, wherein the FPC touch control driver bonding area includes a first FPC touch control driver bonding area and a second FPC touch control driver bonding area, the COF display driver bonding area is disposed between the first FPC touch control driver bonding area and the second FPC touch control driver bonding area; or
wherein the COF display driver bonding area includes a first COF display driver bonding area and a second COF display driver bonding area, the FPC touch control driver bonding area is disposed between the first COF display driver bonding area and the second COF display driver bonding area.

13. The display device of claim 10, wherein the second substrate includes a border extending along the first direction, and the opening is formed at a first end of the border, and the FPC touch control driver bonding area is disposed at a second end of the border.

14. The display device of claim 10, wherein the FPC touch control driver bonding area includes a first FPC touch control driver bonding area and a second FPC touch control driver bonding area, wherein the COF display driver bonding area is disposed between the first FPC touch control driver bonding area and the second FPC touch control driver bonding area; and
wherein the second substrate includes a border extending along the first direction, the opening is formed at the middle of the border, and the first FPC touch control driver bonding area and the second FPC touch control driver bonding area are disposed respectively at two ends of the border.

15. The display device of claim 10, wherein the COF display driver bonding area includes a first COF display driver bonding area and a second COF display driver bonding area, the FPC touch control driver bonding area is disposed between the first COF display driver bonding area and the second COF display driver bonding area;
the second substrate includes a border extending along the first direction and the FPC touch control driver bonding area is disposed at the middle of the border, and two openings are formed respectively at two ends of the border.

16. The display device of claim 10, wherein the first substrate, a light emitting device layer, the COF display driver bonding area, the second substrate, a touch sensing layer, the FPC touch control driver bonding area and a polarizer layer arranged alone the light emitting direction of the touch control display panel;
wherein the light emitting device layer and the COF display driver bonding area are disposed at a side of the first substrate, and the second substrate is disposed at a side, away from the first substrate, of the light emitting device layer; wherein the touch sensing layer and the FPC touch control driver bonding area are disposed at a side, away from the light emitting device layer, of the second substrate; and
wherein the polarizer layer is disposed at a side, away from the second substrate, of the touch sensing layer.

17. The touch control display panel of claim 16, wherein the border area includes a first spacer, a second spacer, a third spacer, the COF display driver bonding area and a fourth spacer arranged alone the second direction;
wherein the first spacer is disposed between an outer edge of the light emitting device layer and an outer edge of the polarizer layer;
wherein the second spacer is disposed between the outer edge of the polarizer layer and an edge of the opening of the second substrate;
wherein the third spacer is disposed between the edge of the opening of the second substrate and an inner edge of the COF display driver bonding area; and wherein the fourth spacer is disposed between an outer edge of the COF display driver bonding area and an edge of the first substrate.

18. A method of fabricating a touch control display panel, the method comprising steps of:
providing a first substrate including a display area carrying portion and a border area carrying portion, wherein the border area carrying portion extends along a first direction, and the display area carrying portion and the border area carrying portion are arranged along a second direction perpendicular to the first direction;
forming a light emitting device layer on a side of the display area carrying portion;
forming a COF display driver bonding area on a side of the border area carrying portion;
forming a second substrate on a side, away from the first substrate, of the light emitting device layer, wherein the first substrate and the second substrate are sequentially arranged along a light emitting direction of the touch control display panel, and the COF display driver bonding area is disposed between the first substrate and the second substrate; and an opening is formed on the second substrate, and the opening is corresponding to the COF display driver bonding area wherein a vertical projection, projected on the first substrate, of the opening covers the COF display driver bonding area;

forming a touch sensing layer and a FPC touch control driver bonding area on a side, away from the light emitting device layer, of the second substrate, wherein the FPC touch control driver bonding area and the opening are arranged along the first direction.

* * * * *